(12) United States Patent
Sharif

(10) Patent No.: US 6,727,716 B1
(45) Date of Patent: Apr. 27, 2004

(54) PROBE CARD AND PROBE NEEDLE FOR HIGH FREQUENCY TESTING

(75) Inventor: Adam K. Sharif, Pomona, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/320,334

(22) Filed: Dec. 16, 2002

(51) Int. Cl.⁷ .............................................. G01R 31/02
(52) U.S. Cl. ...................................... 324/754; 324/761
(58) Field of Search ........................ 324/72.5, 754–758, 324/760–761, 765, 158.1; 439/169, 174, 482, 912

(56) References Cited

U.S. PATENT DOCUMENTS

| | | | |
|---|---|---|---|
| 4,480,223 A | * 10/1984 | Aigo | 324/752 |
| 5,525,911 A | * 6/1996 | Marumo et al. | 324/754 |
| 5,532,613 A | * 7/1996 | Nagasawa et al. | 324/761 |
| 6,420,889 B1 | * 7/2002 | Terada | 324/755 |

* cited by examiner

Primary Examiner—Evan Pert
Assistant Examiner—Minh N. Tang
(74) Attorney, Agent, or Firm—Farjami & Farjami LLP

(57) ABSTRACT

According to one exemplary embodiment, a probe card comprises at least one shielded probe needle. The at least one shielded probe needle comprises a conductor, a dielectric sleeve surrounding at least a portion of the conductor, and a conductive cover surrounding the dielectric sleeve. In accordance with one embodiment, the shielded probe needle operates as a coaxial transmission line and has a substantially constant characteristic impedance. As such, signal attenuation at high frequencies is substantially reduced. Also in the exemplary embodiment, the conductive cover is connected to a ground (or to a reference voltage) and shorts any current in the conductive cover to the ground (or to the reference voltage), thereby substantially reducing or eliminating crosstalk in the probe card. According to one embodiment, the probe card may further comprise an unshielded probe needle, which is not surrounded by a dielectric sleeve or a conductive cover.

23 Claims, 5 Drawing Sheets

PROBE CARD AND PROBE NEEDLE FOR HIGH FREQUENCY TESTING

BACKGROUND OF THE INVENTION

1. Field of the Invention

The present invention generally relates to the field of semiconductor fabrication. More specifically, the invention relates to semiconductor wafer testing.

2. Related Art

In the field of semiconductor manufacturing, dies are formed on a semiconductor wafer and, following wafer fabrication, the dies are tested to identify the properly functioning ones prior to packaging. Packaging involves, among other things, dicing the wafer into separate dies and placing them in protective packages.

During wafer testing, every die is tested to identify those dies that meet requisite specifications, such as customer specifications, for example. During such wafer testing, a conventional tool, for example a probe card, is typically used to interface between the test equipment and a die under test. With a probe card, physical contact with the die under test is typically made by way of probe needles. Conventionally, the tips of the probe needles contact die bonding pads located on the surface of the die to establish electrical contact. Conventionally, probe needles are held in place by a dielectric material physically holding and separating the probe needles and also providing electrical isolation between probe needles. The base of each probe needle (the "base" of each probe needle is situated at an end opposite to the tip of the probe needle) is connected to a corresponding contact on the probe card for interfacing with the test equipment. Conventional probe cards and probe needles, however, have a limited frequency range, which limits the probe cards' ability to test a die. This limited frequency range is due, in part, to unwanted signal attenuation in, and crosstalk between, probe needles at frequencies over 500 mega Hertz (MHz). The unwanted signal attenuation and crosstalk are due to inductive and capacitive effects that are even more pronounced, and thus even less desirable, at higher frequency. As a consequence, conventional probe cards have limited usefulness for testing radio frequency (RF) devices which typically operate at high frequencies.

Accordingly, there is a need in the art for a probe card capable of adequately performing wafer tests at high frequencies. Furthermore, there is a need in the art for a probe card where signal attenuation in, and crosstalk between, probe needles are significantly reduced at high frequencies.

SUMMARY OF THE INVENTION

The present invention is directed to probe card and probe needle for high frequency testing. The invention overcomes the need in the art for a probe card capable of adequately performing wafer tests at high frequencies. Furthermore, the invention substantially reduces signal attenuation in, and crosstalk between, probe needles during high frequency testing.

According to one exemplary embodiment, a probe card comprises at least one shielded probe needle. The at least one shielded probe needle comprises a conductor, a dielectric sleeve surrounding at least a portion of the conductor, and a conductive cover surrounding the dielectric sleeve. During wafer testing, the tip of the conductor interfaces with a corresponding die bonding pad on a semiconductor die.

In accordance with the invention, the shielded probe needle operates as a coaxial transmission line and has a substantially constant characteristic impedance. This characteristic impedance is constant regardless of the signal frequency in the shielded probe needle. As such, signal attenuation at high frequencies is substantially reduced. In one embodiment, the characteristic impedance is approximately fifty ohms which is suitable for many applications. Also in the exemplary embodiment, the conductive cover is connected to a ground (or to a reference voltage) and shorts any current in the conductive cover to the ground (or to the reference voltage), thereby substantially reducing or eliminating crosstalk in the probe card.

An epoxy can be used to house and maintain the at least one shielded probe needle in a particular orientation so that the tip of the conductor makes precise contact with its corresponding die bonding pad on the semiconductor die during wafer testing. In one embodiment, the epoxy comprises a dielectric material. In other embodiments, the epoxy comprises conductive materials and is connected to the ground.

According to one embodiment, the probe card may further comprise an unshielded probe needle, which is not surrounded by a dielectric sleeve or a conductive cover. Other features and advantages of the present invention will become more readily apparent to those of ordinary skill in the art after reviewing the following detailed description and accompanying drawings.

DETAILED DESCRIPTION OF THE INVENTION

The present invention is directed to probe card and probe needle for high frequency testing. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings. It is noted that, for the purpose of ease of illustration, the various elements and dimensions shown in the following figures are not drawn to scale.

Figure 1:
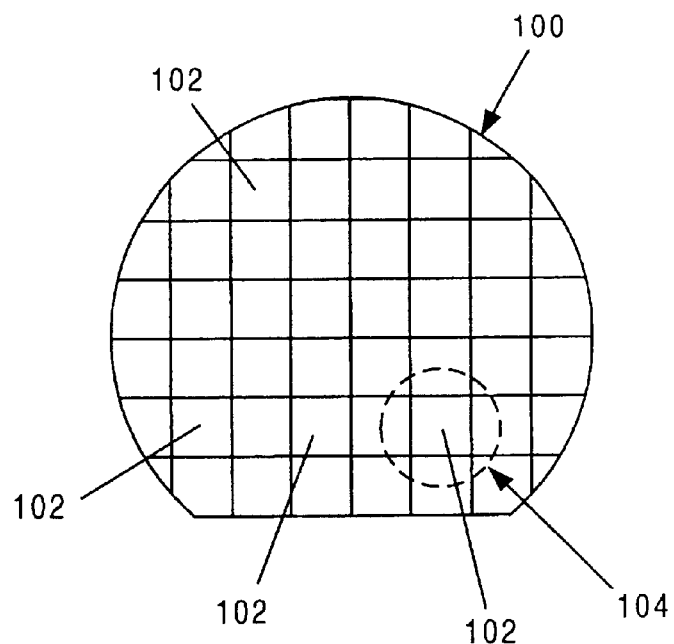
FIG. 1 is a top view of an exemplary semiconductor wafer.

FIG. 1 illustrates a top view of exemplary semiconductor wafer 100 comprising a number of dies 102. Dies 102 may comprise, for example, various devices or integrated circuits as known in the art. Die 102 in region 104 of wafer 100 will now be described with reference to FIG. 2.

Figure 2:
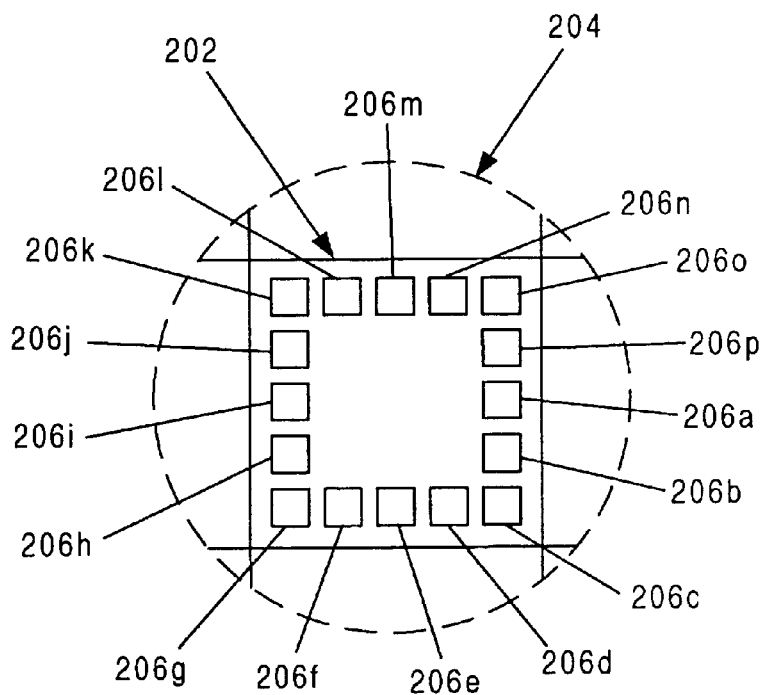
FIG. 2 is an expanded view of a region of the semiconductor wafer of FIG. 1.

In FIG. 2, region 204 shows an enlarged view of region 104 in FIG. 1, where die 202 of region 204 corresponds to die 102 of region 104 in FIG. 1. A number of die bonding pads are fabricated on the surface of die 202, including, for example, die bonding pads 206a through 206p. The number of die bonding pads and the specific arrangement of the die bonding pads on the surface of die 202 may vary from those actually shown in FIG. 2, although the particular arrangement shown in FIG. 2 is referenced in the present application for illustrative purposes. Die bonding pads 206a through 206p provide electrical connectivity to die 202. During testing of die 202, physical contact is made between die bonding pads 206a through 206p and test equipment (not shown) by way of a probe card as described more fully below. Likewise, testing of each die 102 of wafer 100 can be carried out in a manner similar to that described below for testing die 202.

Figure 3:
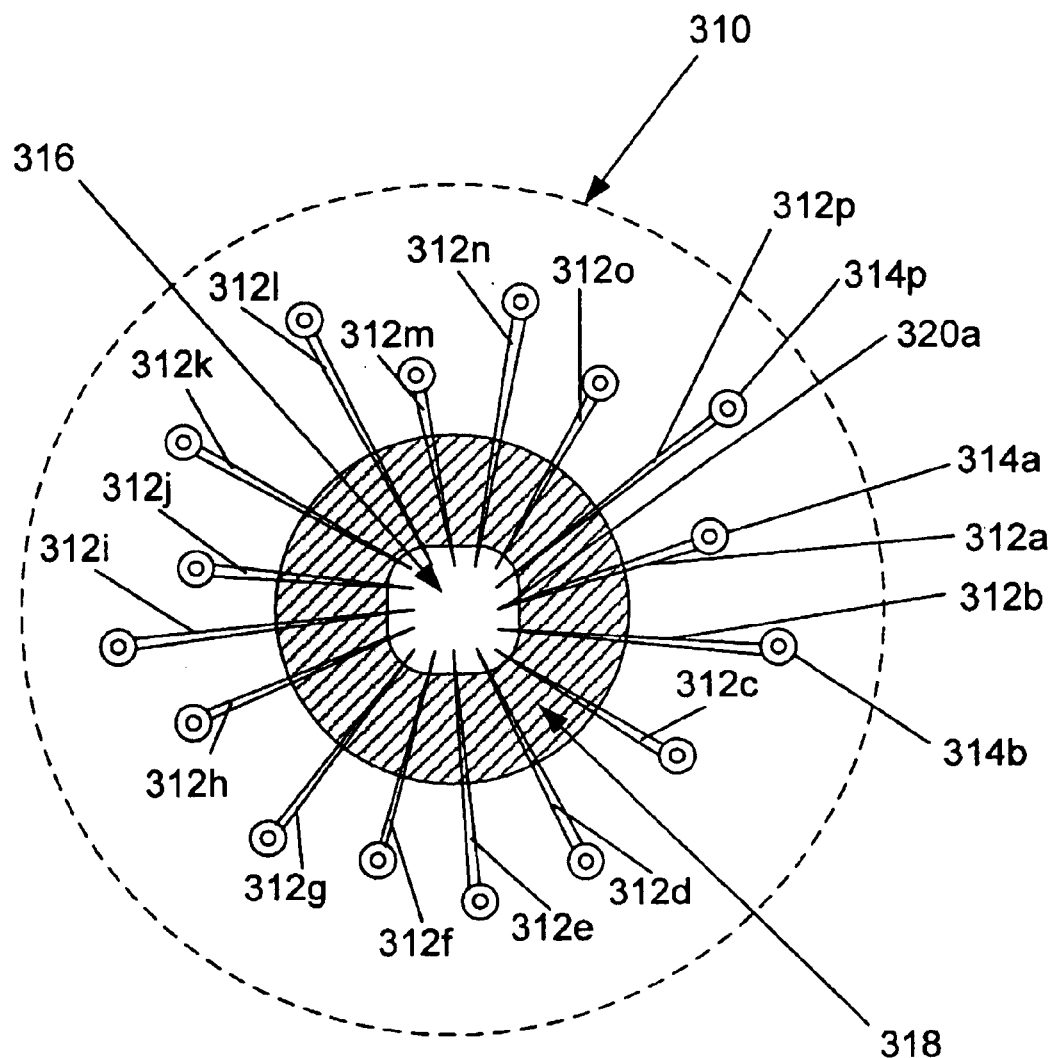
FIG. 3 is a top view of a portion of a known probe card employing conventional probe needles.
Figure 4A:
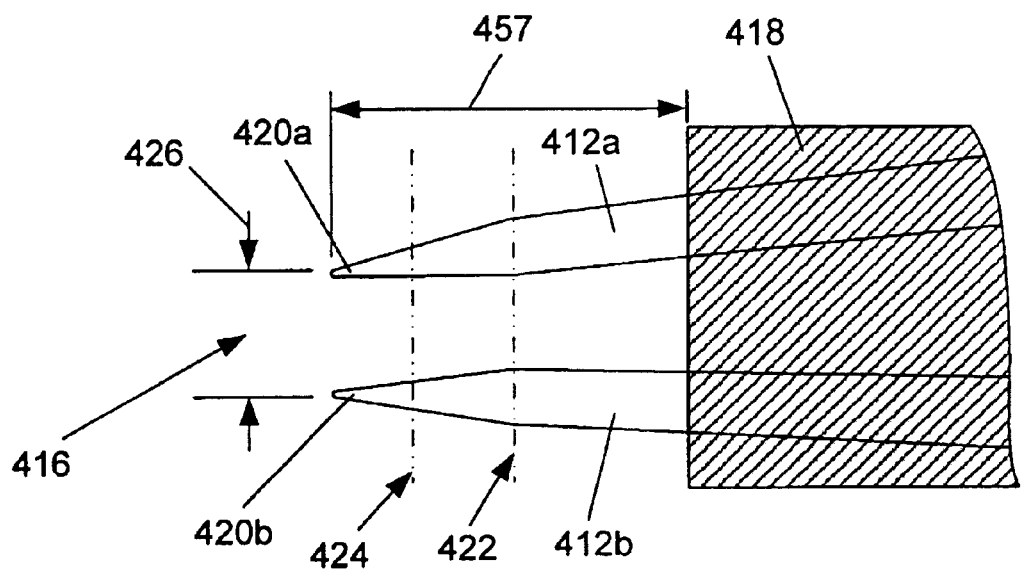
FIG. 4A is an expanded top view of a portion of the known probe card of FIG. 3.
Figure 4B:
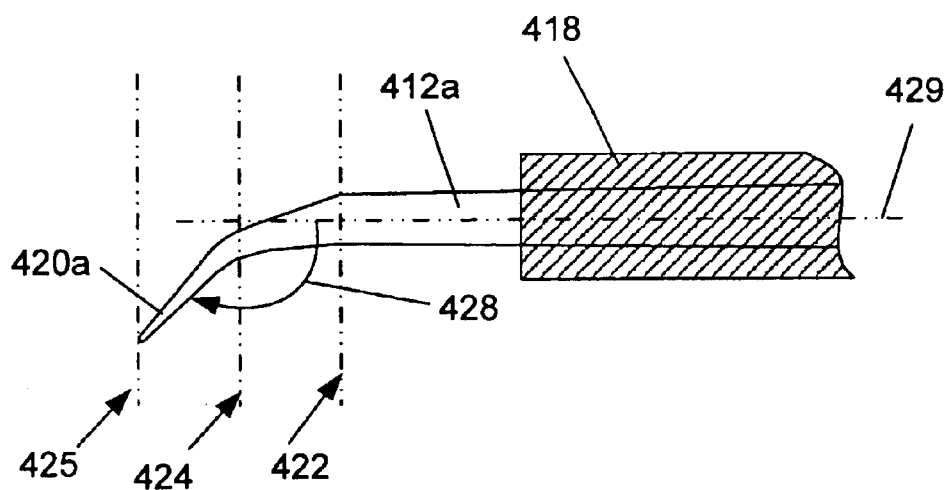
FIG. 4B is a side view of the probe needle of FIG. 4A.

To illustrate the features and advantages of the present invention by way of contrast, a brief description of known probe card 310 for use in semiconductor wafer testing is provided with reference to FIGS. 3, 4A and 4B. In FIG. 3, a top view of a portion of known probe card 310 employing conventional probe needles is generally shown. Probe card 310 can be used to interface between test equipment (not shown) and a particular die under test, e.g., die 202 of FIG. 2.

Known probe card 310 comprises a number of probe needles 312a through 312p. Each probe needle 312a through 312p comprises conductive material, such as, tungsten, for example, and, according to one particular embodiment, each probe needle is approximately one inch in length. In one embodiment each probe needle 312a through 312p has a diameter between four-thousandths of an inch (or 4 mils) to eight-thousandths of an inch (or 8 mils) near the base of the probe needle; while near the tip, e.g. tip 320a of probe needle 312a, the diameter of each probe needle may taper to, for example, approximately 0.7 mil.

During wafer testing, known probe card 310 is placed over the die under test, and the tip of each probe needle makes contact with a corresponding die bonding pad situated in region 316 in FIG. 3. Using die 202 of FIG. 2 as an exemplary die under test, each probe needle tip, such as tip 320a of probe needle 312a, interfaces with a corresponding die bonding pad, such as die bonding pad 206a. The base of each probe needle is connected to a corresponding contact, such as contact 314a, 314b, or 314p on known probe card 310. Test equipment (not shown) can interface contacts of probe card 310, such as contacts 314a, 314b, and 314p, to transmit and acquire test data to and from the die under test.

As noted above, probe needles 312a through 312p make contact with the die under test in region 316 of probe card 310. In order to properly position and orient probe needles 312a through 312p in region 316 to make precise contacts with the die bonding pads, epoxy 318, comprising dielectric material, is used to house and hold steady each probe needle 312a through 312p. For ease of illustration, epoxy 318 is shown as shaded area 318 in FIG. 3. As shown in FIG. 3, epoxy 318 also separates probe needles 312a through 312p and provides electrical isolation between probe needles 312a through 312p.

FIG. 4A shows an enlarged top view of a portion of probe needles 412a and 412b, which correspond respectively to probe needles 312a and 312b in FIG. 3, and where region 416 corresponds to region 316 in FIG. 3. Although the following discussion is limited to probe needles 412a and 412b to preserve brevity, the description of probe needles 412a and 412b provided below also applies to all probe needles of probe card 310.

As noted above, epoxy 418 is used to hold probe needles 412a and 412b so that respective tips 420a and 420b are properly positioned and oriented to precisely contact their corresponding die bonding pads during wafer testing. As illustrated in FIG. 4A, epoxy 418 also separates probe needles 412a and 412b and provides electrical isolation between probe needles 412a and 412b. By way of example, dimension 457 corresponding to the distance between the edge of epoxy 418 and tips 420a and 420b of probe needles 412a and 412b is about 170 to 200 mils.

Distance 426 between tips 420a and 420b of probe needles 412a and 412b corresponds approximately to the distance between the centers of two immediately adjacent die bonding pads of the die under test. For example, distance 426 between tips 420a and 420b can be in the range of about 3 to 4.5 mils. Probe needles 412a and 412b also "taper" from about a position indicated by dashed line 422 down to their corresponding tips 420a and 420b. For example, diameter of probe needle 420a at dashed line 422 may be in the range of about 4 to 8 mils, while at tip 420a, the diameter of probe needle 420a may be about 0.7 mil. Probe needles 412a and 412b begin to angle downward toward the die under test at a position indicated by dashed line 424 for the purpose of contacting with corresponding die bonding pads. For example, FIG. 4B shows a side view of a portion of probe needle 412a. As shown in FIG. 4B, probe needle 412a is angled downward with respect to its elongated axis 429. For example, angle 428 may be about 105 degrees, and the distance between dashed line 424, where probe needle 412 begins to bend, and dashed line 425 at tip 420a, can be approximately 20 mils.

Continuing with reference to FIG. 3, some of the problems with known probe card 310 are now discussed. One problem with probe card 310 is signal attenuation occurring in individual probe needles 312a through 312p at high frequencies. With respect to probe needle 312a, for example, as the signal frequency in probe needle 312a increases, the inductive impedance of probe needle 312a increases. At high frequencies, for example at frequencies over 500 mega Hertz (MHz), the increased inductive impedance in probe needle 312a, results in signal attenuation beyond what can be tolerated.

Another problem with known probe card 310 is signal coupling "crosstalk" occurring between adjacent probe needles, e.g. between probe needle 312a and probe needle 312b. The crosstalk between adjacent probe needles in probe card 310 can be attributed to the mutual capacitance and inductance between adjacent probe needles. This crosstalk increases as the signal frequency increases.

Figure 5:
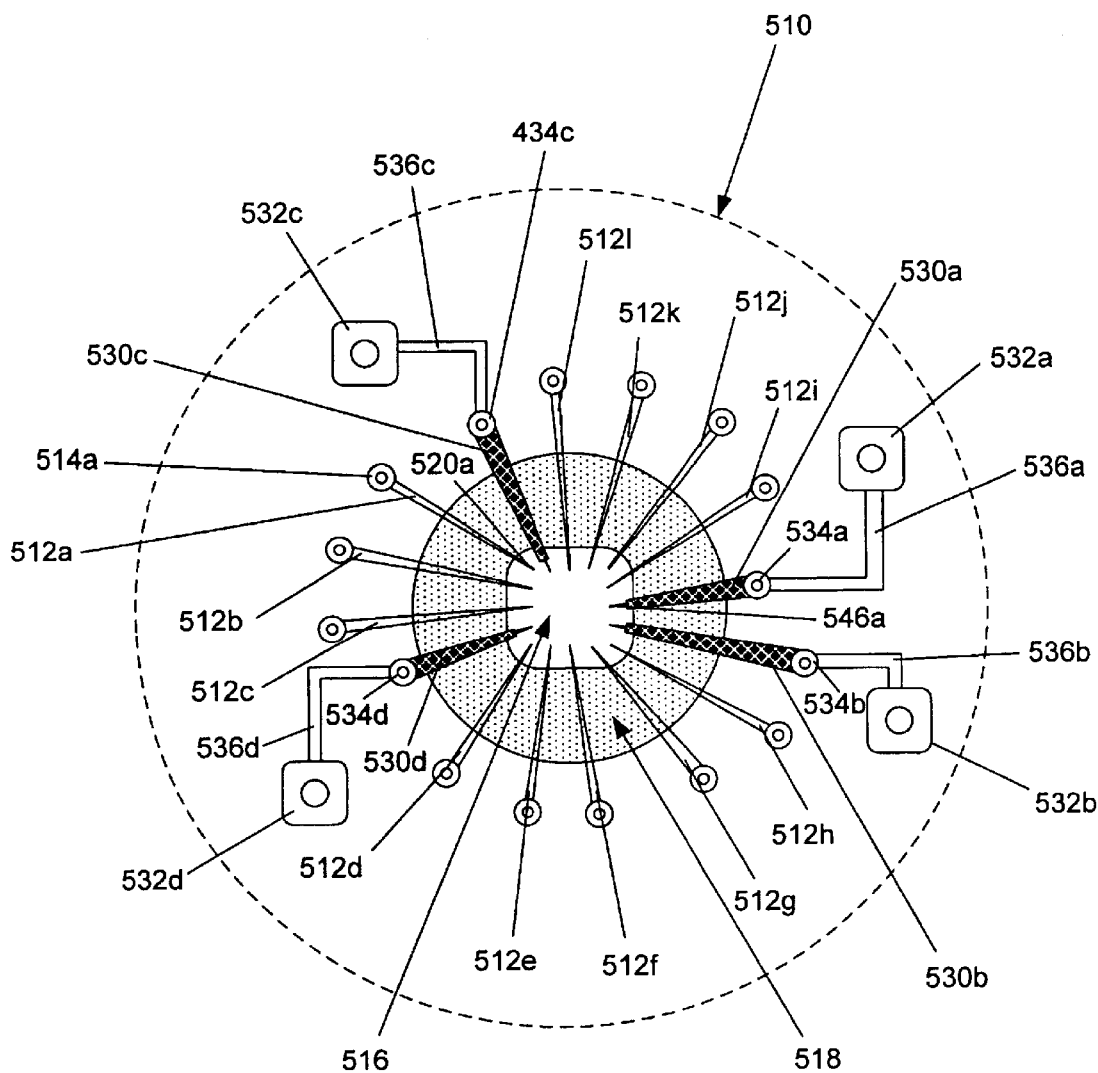
FIG. 5 is a top view of a portion of a probe card in accordance with one embodiment of the present invention.

Referring now to FIG. 5, there is shown a top view of a portion of probe card 510 employing shielded probe needles in accordance with one embodiment of the present invention. It is noted that the number of shielded probe needles and the specific orientation of the shielded probe needles employed in probe card 510 may vary from that actually shown in FIG. 5, since the particular arrangement of probe needles shown in FIG. 5 is provided for illustrative purposes.

In the particular embodiment shown in FIG. 5, probe card 510 includes shielded probe needles 530a, 530b, 530c, and 530d as well as unshielded probe needles 512a through 512l, although an alternative probe card having only shielded probe needles may be implemented in other embodiments of the present invention. As described in greater detail below, each shielded probe needle 530a through 530d operates as a coaxial transmission line having a substantially constant characteristic impedance regardless of the signal frequency, thereby resulting in reduced or eliminated signal attenuation. Further, as described more fully below, the particular structure of shielded probe needles 530a through 530d also results in reduced or eliminated crosstalk between each shielded probe needle and other shielded or unshielded probe needles of probe card 510.

Shielded probe needles 530a through 530d are used for interfacing with high frequency die bonding pads of the die under test. In other words, shielded probe needles 530a through 530d are used for transmitting and receiving high frequency signals to and from those particular die bonding pads which input and output high frequency signals to and from the high frequency circuits on the die. However, probe needles 530a through 530d can also be used for handling other types of signals, e.g. for connection to a voltage supply or a ground, or for transmitting and receiving low frequency signals. The specific details of shielded probe needles 530a through 530d according to one embodiment are described more fully below in conjunction with FIG. 6.

Unshielded probe needles 512a through 512l may be used for connection to a power supply or a ground or for transmission of low frequency signals, where the above described inductive and capacitive effects are less prominent and do not result in intolerable signal attenuation in and crosstalk between unshielded probe needles 512a through 512l. According to the invention's embodiment shown in FIG. 5, only the "high frequency probe needles" are shielded while the remaining probe needles remain unshielded. As such, lower manufacturing cost is achieved since only those probe needles that, in the absence of the present invention, would cause too much signal attenuation and crosstalk, are shielded.

During wafer testing, probe card 510 is placed over the die under test, and the tips of shielded probe needles 530a through 530d and unshielded probe needles 512a through 512l make contact with corresponding die bonding pads in region 516. As an example, tip 546a of shielded probe needle 530a may interface with a "high frequency die bonding pad," such as die bonding pad 206a on die 202 shown in FIG. 2. As another example, tip 520a of unshielded probe needle 512a may interface with a "low frequency die bonding pad," such as die bonding pad 206j of die 202 shown in FIG. 2. Likewise, the tips of shielded probe needles 530b, 530c, and 530d and unshielded probe needles 512b through 512l interface with their corresponding die bonding pads.

The base of each shielded probe needle 530a, 530b, 530c, and 530d (the "base" of each probe needle is situated at an end opposite to the tip of the probe needle) is connected to a corresponding connector 532a, 532b, 532c, and 532d. For example, shielded probe needle 530a is connected to connector 532a by way of trace 536a and contact 534a. Trace 536a may, for example, be a 50 ohm trace. Each shielded probe needle 530b through 530d is similarly connected to its corresponding connector 532b through 532d via corresponding contacts 534b through 534d and corresponding traces 536b through 536d as shown in FIG. 5. An appropriate test equipment may interface with connectors 532a through 532d of shielded probe needles 530a through 530d for handling high frequency signals and with contacts 514a through 514l of unshielded probe needles 512a through 512l for handling low frequency or DC signals.

In the exemplary embodiment shown in FIG. 5, epoxy 518 is used to hold and house shielded probe needles 530a through 530d and unshielded probe needles 512a through 512l in order to maintain a proper position and orientation of shielded probe needles 530a through 530d and unshielded probe needles 512a through 512l so that they make precise contacts with their corresponding die bonding pads during wafer testing. Depending on the particular embodiment of the present invention, epoxy 518 may comprise different types of materials, ranging from various dielectrics to even conductive materials, used for holding shielded probe needles 530a through 530d and unshielded probe needles 512a through 512l. As described more fully below, when epoxy 518 is a dielectric, its dielectric constant (k) has a significantly reduced impact on probe card 510 employing shielded probe needles 530a through 530d and, thus, dielectric materials for forming epoxy 518 may be easily selected from a wider range of material choices relative to the range of material choices available for epoxy 318 of known probe card 310.

According to one embodiment of the present invention, probe card 510 includes only shielded probe needles or, if unshielded probe needles are used, the unshielded probe needles may be limited to establishing connections to a ground (or to a reference voltage). In that embodiment, epoxy 518 can comprise conductive materials and it (i.e. epoxy 518) is connected to the ground (or the reference voltage).

Figure 6:
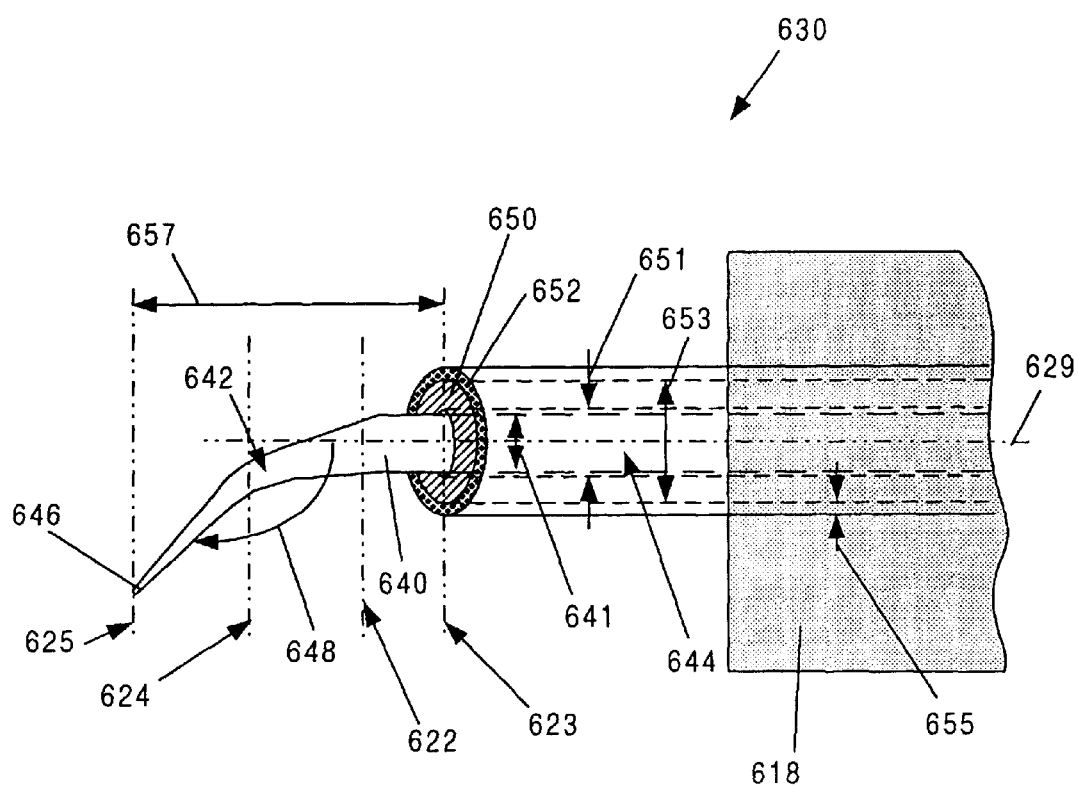
FIG. 6 is a perspective view of a portion of a shielded probe needle in accordance with one embodiment of the present invention.

Further details related to shielded probe needles 530a through 530d are now discussed by referring to FIG. 6. In FIG. 6, a perspective view of a portion of shielded probe needle 630 is generally shown, where shielded probe needle 630 corresponds to shielded probe needles 530a through 530d in FIG. 5.

Shielded probe needle 630 operates substantially as a coaxial transmission line and comprises "center conductor" 640 (also referred to as "conducting means"), "dielectric sleeve" 650 (also referred to as "insulating means") surrounding a portion of center conductor 640, and "conductive cover" 652 (also referred to as a "shielding means") surrounding dielectric sleeve 650. In the present application, portion 644 of center conductor 640 surrounded by dielectric sleeve 650 and conductive cover 652 is also referred to as "shielded portion" 644, while portion 642 of center conductor 640 not surrounded by dielectric sleeve 650 and conductive cover 652 is also referred to as "unshielded portion" 642. It is noted that although in the embodiment shown in FIG. 6, "center conductor" 640 is substantially at the center of shielded probe needle 630, "center conductor" 640 does not have to be at the center of shielded probe needle 630 in other embodiments of the invention.

Center conductor 640 comprises conductive material, such as tungsten for example. The length of center conductor 640 varies according to the particular application. By way of example, center conductor 640 is about 1000 mils long in one embodiment. In one embodiment, dimension 641 defining the diameter of center conductor 640 along shielded portion 644 is approximately 3 mils. The diameter of center conductor 640 decreases from approximately 3 mils at the position indicated by dashed line 622 to about 0.7 mil at the position indicated by dashed line 625, i.e. at tip 646. Also as shown in FIG. 6, tip 646 of center conductor 640 is angled downward with respect to elongated axis 629. For example, according to one embodiment, angle 648 may be about 105 degrees, and the distance between the position indicated by dashed line 624, where center conductor 640 begins to bend, and the position indicated by dashed line 625, i.e. tip 646, is approximately 20 mils. Dimension 657, from dashed line 623 to dashed line 625, corresponds to the length of unshielded portion 642 of center conductor. According to one embodiment, dimension 657 is about 50 mils. As described above in relation to FIG. 5, the base of shielded probe needle 630 is connected to a contact which is in turn coupled to a corresponding connector through a trace. An appropriate test equipment would interface with the connector as described above.

Dielectric sleeve 650 surrounds shielded portion 644 of center conductor 640 and, according to one embodiment, has a common axis with center conductor 640 and has a substantially constant "inside diameter" and a substantially constant "outside diameter." Dimension 651 corresponds to the "inside diameter" of dielectric sleeve 650, which is the diameter of the dielectric cavity in which the center conductor is housed. In one embodiment, dimension 651, i.e. the inside diameter, is approximately 4.2 mils. Dimension 653 corresponds to the "outside diameter" of dielectric sleeve 650, which corresponds to the distance between diametrically opposite surfaces of dielectric sleeve 650. In one embodiment, dimension 653, i.e. the outside diameter, is approximately 8.8 mils. Dielectric sleeve 650 comprises a polymer in one embodiment, and electrically insulates center conductor 640. According to one embodiment, dielectric sleeve 650 comprises a polymer having a dielectric constant of about 3.5.

Conductive cover 652 surrounds dielectric sleeve 650 and shielded portion 644 and, according to one embodiment, has a common axis with dielectric sleeve 650 and shielded portion 644. According to one embodiment, conductive cover 652 comprises copper and gold, and dimension 655 corresponding to the thickness of conductive cover 652 is about 1.5 mils. Conductive cover 652 is connected to a ground (or to a reference voltage), and provides a ground shield as described more fully below. In the embodiment shown in FIG. 6, epoxy 618 is used to house and maintain shielded probe needle 630 in a proper position and orientation so that tip 646 of shielded probe needle 630 makes precise contact with its corresponding die bonding pad on the die during wafer testing.

Shielded probe needle 630, as described above, operates as a coaxial transmission line and, as such, provides a substantially constant characteristic impedance ($Z_c$) along shielded probe needle 630, regardless of the signal frequency in shielded probe needle 630. In one particular embodiment, for example, a constant characteristic impedance $Z_c$ of approximately 50 ohms is achieved for which is desirable in many applications.

Shielded probe needle 630 results in a constant $Z_c$ because shielded probe needle 630 operates as a coaxial transmission line. For a coaxial transmission line, such as shielded probe needle 630, the characteristic impedance $Z_c$ is defined by the following equation:

$$Z_c = \sqrt{\frac{L}{C}} \quad \text{(Equation 1)}$$

where:

$$\frac{L}{C} = \frac{60}{\sqrt{k}} \ln\left(\frac{D1}{D2}\right) \quad \text{(Equation 2)}$$

where k is the dielectric constant of dielectric sleeve 650, D1 is the outside diameter of dielectric sleeve 650, and D2 is the inside diameter of dielectric sleeve 650. Since k, D1 and D2 of dielectric sleeve 650 can be selected and controlled for shielded probe needle 630, characteristic impedance $Z_c$ of shielded probe needle 630 can be closely controlled. As defined by Equations 1 and 2, characteristic impedance $Z_c$ is independent of the signal frequency in shielded probe needle 630 and, thus, characteristic impedance $Z_c$, for shielded probe needle 630, can be closely controlled regardless of the signal frequency in shielded probe needle 630. With a relatively constant characteristic impedance $Z_c$ for shielded probe needle 630, signal attenuation is greatly reduced or eliminated in shielded probe needle 630. Moreover, the desired value of characteristic impedance $Z_c$ can be closely controlled by selecting and controlling the k, D1 and D2 of dielectric sleeve 650, regardless of the signal frequency in shielded probe needle 630.

Furthermore, conductive cover 652, which surrounds shielded portion 644 of center conductor 640 and is connected to a ground (or to a reference voltage), provides a ground shield around the shielded portion 644 of center conductor 640 and thereby substantially reduces the capacitive and inductive effects between shielded probe needle 630 and other probe needles on the same probe card. In this way, conductive cover 652 converts any electric fields, existing due to capacitive or inductive effects, to current and shorts any such current to ground. As a consequence, conductive cover 652 substantially reduces or eliminates crosstalk between shielded probe needle 630 and other probe needles due to the reduction of capacitive and inductive effects between shielded probe needle 630 and other probe needles on the same probe card. Moreover, due to significant reduction or elimination of capacitive effects, dielectric constant k of epoxy 618 in FIG. 6 (or epoxy 518 in FIG. 5) will not affect crosstalk between probe needles. As such, dielectric materials for forming epoxy 518 may be easily selected from a wider range of material choices relative to the range of material choices available for epoxy 318 of known probe card 310. The reason is that high dielectric constant materials (as well as low dielectric constant materials) can now be considered for use in forming epoxy 518 in various embodiments of the invention's probe card 510.

As described above, these benefits are achieved while attaining a relatively constant $Z_c$ for shielded probe needle 630 regardless of the signal frequency in shielded probe needle 630. In sum, probe card 510, thus employing shielded probe needles 530a through 530d (each being configured as shielded probe needle 630) results insignificantly reduced signal attenuation in and crosstalk between probe needles. Thus, due to significant reduction of signal attenuation and crosstalk, probe card 510 can be used for testing radio frequency (RF) devices which operate at high frequencies.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the number of shielded probe needles and the specific arrangement of probe needles on the probe card can be modified without departing from the spirit and scope of the present invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, probe card and probe needle for high frequency testing have been described.

What is claimed is:

1. A probe card for testing a semiconductor die, said probe card including at least one shielded probe needle, said at least one shielded probe needle comprising:
    a conductor having a tip for interfacing with a die bonding pad on said semiconductor die;
    a dielectric sleeve surrounding at least a portion of said conductor;
    a conductive cover surrounding said dielectric sleeve, said conductive cover being connected to a reference voltage, wherein said at least one shielded probe needle has a substantially constant characteristic impedance, and wherein said at least one shielded probe needle reduces crosstalk in said probe card;
    an unshielded portion, wherein said tip of said conductor in said unshielded portion is angled so that said tip of said conductor can be interfaced with said die bonding pad.

2. The probe card of claim 1 wherein said reference voltage is a ground voltage.

3. The probe card of claim 1 further comprising at least one unshielded probe needle, said at least one unshielded probe needle comprising a conductive needle, wherein said conductive needle is not surrounded by a dielectric sleeve, and wherein said conductive needle is not surrounded by a conductive cover.

4. The probe card of claim 1 wherein said substantially constant characteristic impedance is determined by a dielectric constant, an outside diameter, and an inside diameter of said dielectric sleeve.

5. The probe card of claim 4 wherein said dielectric constant, said outside diameter and said inside diameter cause said characteristic impedance to be approximately fifty ohms.

6. The probe card of claim 1 further comprising an epoxy housing and positioning said at least one shielded probe needle in said probe card.

7. The probe card of claim 6 wherein said epoxy comprises a dielectric.

8. The probe card of claim 6 wherein said epoxy comprises a conductive material wherein said conductive material is coupled to a reference voltage.

9. The probe card of claim 8 wherein said reference voltage is a ground voltage.

10. The probe card of claim 1 wherein said dielectric sleeve comprises a polymer.

11. A shielded probe needle situated on a probe card, said shielded probe needle comprising:
    a conductor having a tip configured to interface with a die bonding pad on a semiconductor die;
    a dielectric sleeve surrounding at least a portion of said conductor;
    a conductive cover surrounding said dielectric sleeve, said conductive cover being connected to a ground, said conductive cover shorting current in said conductive cover to said ground;
    an unshielded portion, wherein said tip of said conductor in said unshielded portion is angled so that said tip of said conductor can be interfaced with said die bonding pad.

12. The shielded probe needle of claim 11 wherein said shielded probe needle has a substantially constant characteristic impedance.

13. The shielded probe needle of claim 12 wherein said substantially constant characteristic impedance is determined by a dielectric constant, an outside diameter, and an inside diameter of said dielectric sleeve.

14. The shielded probe needle of claim 13 wherein said dielectric constant, said outside diameter and said inside diameter cause said characteristic impedance to be approximately fifty ohms.

15. The shielded probe needle of claim 11 wherein said dielectric sleeve comprises a polymer.

16. A shielded probe needle comprising:
    conducting means for interfacing with a die bonding pad on a semiconductor die;
    insulating means for insulating at least a portion of said conducting means;
    shielding means surrounding said insulating means, said shielding means being connected to a ground, said shielding means shorting current in said shielding means to said ground;
    an unshielded portion, wherein a tip of said conducting means in said unshielded portion is angled so that said tip can be interfaced with said die bonding pad.

17. The shielded probe needle of claim 16 wherein said shielded probe needle has a substantially constant characteristic impedance.

18. The shielded probe needle of claim 17 wherein said substantially constant characteristic impedance is determined by a dielectric constant, an outside diameter, and an inside diameter of said insulating means.

19. The shielded probe needle of claim 18 wherein said dielectric constant, said outside diameter and said inside diameter cause said characteristic impedance to be approximately fifty ohms.

20. The shielded probe needle of claim 16 wherein said insulating means comprises a polymer.

21. A probe card for testing a semiconductor die, said probe card including at least one shielded probe needle, said at least one shielded probe needle comprising:
    a conductor having a tip for interfacing with a die bonding pad on said semiconductor die;
    a dielectric sleeve surrounding at least a portion of said conductor;
    a conductive cover surrounding said dielectric sleeve, said conductive cover being connected to a reference voltage, wherein said at least one shielded probe needle has a substantially constant characteristic impedance, and wherein said at least one shielded probe needle reduces crosstalk in said probe card;
    at least one unshielded probe needle, said at least one unshielded probe needle comprising a conductive needle, wherein said conductive needle is not surrounded by a dielectric sleeve, and wherein said conductive needle is not surrounded by a conductive cover.

22. A probe card for testing a semiconductor die, said probe card including at least one shielded probe needle, said at least one shielded probe needle comprising:
    a conductor having a tip for interfacing with a die bonding pad on said semiconductor die;

a dielectric sleeve surrounding at least a portion of said conductor;

a conductive cover surrounding said dielectric sleeve, said conductive cover being connected to a reference voltage, wherein said at least one shielded probe needle has a substantially constant characteristic impedance, and wherein said at least one shielded probe needle reduces crosstalk in said probe card;

an epoxy housing and positioning said at least one shielded probe needle in said probe card, wherein said epoxy comprises a conductive material, wherein said conductive material is coupled to a reference voltage.

23. The probe card of claim 22 wherein said reference voltage is a ground voltage.

* * * * *